(12) United States Patent
Kim et al.

(10) Patent No.: US 9,419,544 B2
(45) Date of Patent: Aug. 16, 2016

(54) ENERGY HARVESTING DEVICE HAVING SELF-POWERED TOUCH SENSOR

(71) Applicant: SAMSUNG ELECTRONICS CO., LTD., Suwon-si (KR)

(72) Inventors: Hyun-jin Kim, Hwaseong-si (KR); Young-jun Park, Suwon-si (KR); Steve Park, Stanford, CA (US)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 380 days.

(21) Appl. No.: 14/166,354

(22) Filed: Jan. 28, 2014

(65) Prior Publication Data

US 2014/0210313 A1    Jul. 31, 2014

(30) Foreign Application Priority Data

Jan. 28, 2013   (KR) .................. 10-2013-0009450

(51) Int. Cl.
*H01L 41/113*  (2006.01)
*H02N 2/18*    (2006.01)

(52) U.S. Cl.
CPC ............. *H02N 2/18* (2013.01); *H01L 41/113* (2013.01)

(58) Field of Classification Search
CPC ........ H01L 41/113; H02N 2/18; H02N 2/183; H02N 2/186; H02N 2/188
USPC ................................................. 310/311–371
See application file for complete search history.

(56) References Cited

U.S. PATENT DOCUMENTS

| | | | |
|---|---|---|---|
| 5,349,263 A * | 9/1994 | Katayama | ............. G06F 3/0354 310/338 |
| 6,586,095 B2 | 7/2003 | Wang et al. | |
| 7,705,523 B2 | 4/2010 | Wang et al. | |
| 8,633,633 B2 * | 1/2014 | Vaidyanathan | .......... H02N 2/18 310/339 |
| 8,669,692 B2 * | 3/2014 | Jean-Mistral | ......... H01L 41/193 310/339 |
| 2009/0066195 A1 | 3/2009 | Wang et al. | |
| 2009/0115293 A1 | 5/2009 | Wang et al. | |
| 2009/0309843 A1 | 12/2009 | Kim et al. | |

(Continued)

FOREIGN PATENT DOCUMENTS

| JP | 2010-051945 A | 3/2010 |
|---|---|---|
| KR | 10-2010-0073843 A | 7/2010 |
| KR | 10-2012-0083261 A | 7/2012 |

OTHER PUBLICATIONS

Mannsfeld, et al., "Highly sensitive flexible pressure sensors with microstructured rubber dielectric layers", Nature Materials, vol. 9, Oct. 2010, pp. 859-864.

(Continued)

*Primary Examiner* — Thomas Dougherty
(74) *Attorney, Agent, or Firm* — Sughrue Mion, PLLC

(57) ABSTRACT

Provided is an energy harvesting device having a self-powered touch sensor so that the energy harvesting device is capable of sensing pressure due to an external touch without using external power and harvesting and storing energy generated in response to the touch pressure. The energy harvesting device includes first and second electrodes facing each other, an energy generation layer disposed on the first electrode, and an elastic layer disposed on the second electrode layer, the elastic layer facing the energy generation layer and being configured to be elastically deformed according to pressure applied to the elastic layer. The energy generation layer is configured to generate energy according to the pressure applied to the energy generation layer.

20 Claims, 7 Drawing Sheets

(56) References Cited

U.S. PATENT DOCUMENTS

| | | | |
|---|---|---|---|
| 2010/0109482 A1* | 5/2010 | Sunaga | F03B 13/14 310/339 |
| 2010/0117488 A1 | 5/2010 | Wang et al. | |
| 2010/0236239 A1* | 9/2010 | Kroizer | F03G 6/003 60/641.8 |
| 2011/0084345 A1 | 4/2011 | Park et al. | |
| 2011/0088434 A1 | 4/2011 | Slater et al. | |
| 2011/0220391 A1 | 9/2011 | Oka et al. | |
| 2012/0119621 A1* | 5/2012 | Frey | H02N 2/18 310/330 |
| 2012/0119624 A1* | 5/2012 | Vamvas | H02N 2/18 310/339 |
| 2012/0133247 A1* | 5/2012 | Lee | H01L 41/183 310/339 |
| 2013/0020909 A1* | 1/2013 | Kim | H02N 2/18 310/339 |
| 2013/0175901 A1* | 7/2013 | Cha | H01L 41/113 310/339 |
| 2014/0167564 A1* | 6/2014 | Hwang | H01L 41/047 310/339 |

OTHER PUBLICATIONS

Fan, et al., "Transparent Triboelectric Nanogenerators and Self-Powered Pressure Sensors Based on Micropatterened Plastic Films", Nano Letters, American Chemical Society Publications, 2012: vol. 12: pp. 3109-3114.

* cited by examiner

ENERGY HARVESTING DEVICE HAVING SELF-POWERED TOUCH SENSOR

CROSS-REFERENCE TO RELATED APPLICATION

This application claims the benefit of Korean Patent Application No. 10-2013-0009450, filed on Jan. 28, 2013, in the Korean Intellectual Property Office, the disclosure of which is incorporated herein in its entirety by reference.

BACKGROUND

1. Field

The present disclosure relates to an energy harvesting device, and more particularly, to an energy harvesting device having a self-powered touch sensor so that the energy harvesting device is capable of sensing an external touch pressure without using any external power and harvesting and storing energy generated in response to the external touch pressure.

2. Description of the Related Art

Recently, as the interest in green energy has increased, energy harvesting technologies that convert ambient energy such as geothermal energy, solar energy, mechanical energy generated by the movement of persons or vibrations of bridges, wind energy, and the like into electrical energy have been actively investigated. Energy harvesting devices are novel environmentally-friendly energy devices, and even though the amount of power generated by such devices is small, energy harvesting devices can be used in conjunction with low-powered devices, and thus, the use of energy harvesting devices has considerably increased.

SUMMARY

Provided is an energy harvesting device having a self-powered touch sensor so that the energy harvesting device is capable of sensing pressure due to an external touch without using any external power and harvesting and storing energy generated in response to the external touch.

Additional aspects will be set forth in part in the description which follows and, in part, will be apparent from the description, or may be learned by practice of the exemplary embodiments.

According to an exemplary embodiment, an energy harvesting device having a self-powered touch sensor includes: first and second electrodes facing each other; an energy generation layer disposed on the first electrode; and an elastic layer disposed on the second electrode layer, the elastic layer facing the energy generation layer, the elastic layer being configured to be elastically deformed according to pressure applied to the elastic layer, wherein the energy generation layer is configured to generate energy according to the pressure applied to the energy generation layer.

The energy generation layer may include a piezoelectric film configured to generate electricity in response to the pressure applied thereto or an electrostatic film having a surface that is electrically charged.

The piezoelectric film may include ZnO, GaN, ZnMgO, InN, BTO, PZT, PVDF, or a polymer including piezoelectric nanoparticles and the electrostatic film may include a material having a natural surface potential and selected from among fluorinate polymer, polyethyleneterephthalate (PET), or polypropylene, or may include a material having a surface that is artificially polarized and selected from among quartz or $SiO_2$.

The elastic layer may have a porous nanostructure.

The elastic layer may include protrusions which protrude toward the first electrode, and pores which are defined between the protrusions.

Each of the pores may have a diameter of about 500 nm to about 2 μm and a depth of about 1 μm to about 8 μm.

Each of the protrusions may have a rectangular shape and protrude vertically toward the first electrode.

Each of the protrusions may have a pyramidal shape with a width gradually increasing in a direction moving from the energy generation layer towards the second electrode and gradually decreasing in a direction moving away from the second electrode towards the energy generation layer.

The protrusions may include first protrusions that are in contact with a surface of the energy generation layer and second protrusions that are spaced apart from the surface of the energy generation layer.

Each of the first and second electrodes may be formed of a transparent material.

Each of the first and second electrodes may include a stretchable electrode formed by spray-coating a metal nanotube or a carbon nanotube.

Each of the first and second electrodes may include an array of a plurality of patterns arranged perpendicular to each other.

The first electrode may include an array of first electrodes arranged in a pattern in which the first electrodes are parallel to each other and extend linearly in a first direction, and the second electrode may include an array of second electrodes arranged in a pattern in which the second electrodes are parallel to each other and extend linearly in a second direction perpendicular to the first direction.

According to another exemplary embodiment, an energy harvesting device having a self-powered touch sensor includes: first and second electrodes facing each other; an elastic layer disposed on the second electrode and including protrusions protruding toward the first electrode and pores between the protrusions; and an energy generation layer disposed along a surface of the elastic layer, wherein the energy generation layer is configured to generate energy according to the pressure applied to the energy generation layer, and the elastic layer is configured to be elastically deformed according to pressure applied to the elastic layer.

The protrusions may include first protrusions that are in contact with a surface of the first electrode and second protrusions that are spaced apart from the second electrode.

According to a further exemplary embodiment, provided is a touch screen and an artificial skin including the above-described energy harvesting device that has a self-powered touch sensor.

BRIEF DESCRIPTION OF THE DRAWINGS

These and/or other aspects will become apparent and more readily appreciated from the following description of the exemplary embodiments, taken in conjunction with the accompanying drawings of which.

DETAILED DESCRIPTION

Figure 1:
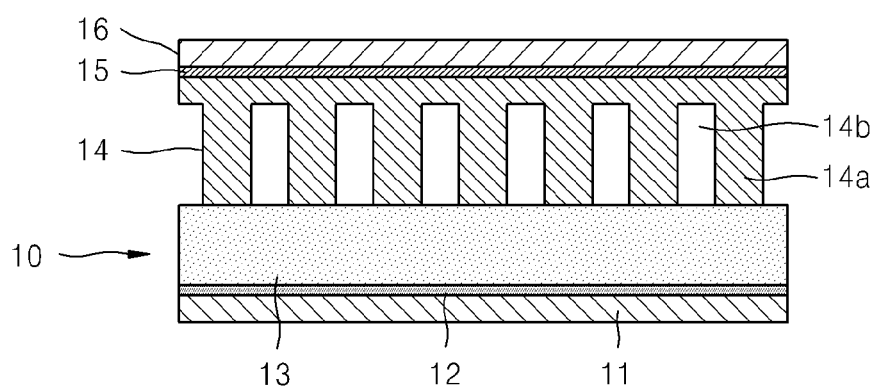
FIG. 1 is a schematic cross-sectional view of an energy harvesting device having a self-powered touch sensor according to an exemplary embodiment.

Hereinafter, an energy harvesting device having a self-powered touch sensor will be described with reference to the accompanying drawings. Like reference numerals in the drawings denote like elements. In the drawings, the sizes or thicknesses of elements may be exaggeratedly illustrated for clarity and convenience of description. The exemplary embodiments described herein are merely examples and can be embodied in various forms. In the description of the exemplary embodiments, it is understood that when an element is referred to as being 'on' or 'under' other element, the terms 'on' and 'under' includes both the meanings of being 'directly' and 'indirectly' on or under the other element.

FIG. 1 is a schematic cross-sectional view of an energy harvesting device having a self-powered touch sensor according to an exemplary embodiment. Referring to FIG. 1, an energy harvesting device 10 having a self-powered touch sensor includes a first substrate 11, a first electrode 12 disposed on a top surface of the first substrate 11, a second substrate 16, a second electrode 15 disposed on a lower surface of the second substrate 12, an energy generation layer 13 disposed on a top surface of the first electrode 12, and an elastic layer 14 disposed on a lower surface of the second electrode 15. The first and second substrates 11 and 16 are disposed to face each other. Thus, the elastic layer 14 may be disposed on the energy generation layer 13.

The energy generation layer 13 may generate energy in response to an external pressure or vibrations. For example, the energy generation layer 13 may include a piezoelectric film that generates electricity in response to a pressure applied thereto or may include an electrostatic film having a surface that is strongly electrically charged. For example, the piezoelectric film may be formed of a semiconductor piezoelectric material such as ZnO, GaN, ZnMgO, InN, or BTO (BaTiO$_3$), a ceramic material such as PZT, or a polymer-based material such as polyvinylidene fluoride (PVDF), or may be manufactured by dispersing a plurality of piezoelectric nanoparticles into a polymer, such as poly-dimethylsiloxane (PDMS). Also, the electrostatic film may be formed of a material having a naturally strong surface potential or a material having a surface that is artificially polarized. For example, the electrostatic film may be formed of a fluorinate polymer such as Teflon®, polyethyleneterephthalate (PET), or polypropylene, or may be manufactured by polarizing quartz or SiO$_2$.

The elastic layer 14 together with the two electrodes 12 and 15 constitutes a capacitor. A capacitance of the capacitor may be changed when a thickness of the elastic layer 14 varies according to an external pressure and/or vibration. Also, the elastic layer 14 may transfer the external pressure to the energy generation layer 13. When the elastic layer 14 deforms in response to the external force, if the external force is removed, the elastic layer 14 restores to an original shape by its elasticity. According to an exemplary embodiment, the elastic layer 14 may have a porous nanostructure so that the elastic layer 14 is sufficiently deformed by the external pressure and has a strong elastic restoring force. For example, as shown in FIG. 1, the elastic layer 14 may include a plurality of vertical protrusions 14a protruding toward the first electrode 12 and pores 14b defined between the protrusions 14a. The protrusions 14a may have many different types of structures, such as, for example, a comb structure, a honeycomb construction, or a lattice structure. To sufficiently increase the deformation and elastic restoration force of the elastic layer 14, an aspect ratio of the pores 14b may be approximately 1:5. For example, each of the pores 14b may have a diameter of about 500 nm to about 2 μm and a depth of about 1 μm to about 8 μm, although it is understood that the pores 14b may have other diameters and depths according to other exemplary embodiments.

When external pressure is applied to the energy harvesting device 10 having the above-described structure, the elastic layer 14 deforms, and thus, the capacitance of the energy harvesting device 10 changes. At the same time, electrical energy generated by the energy generation layer 13 may be outputted through the two electrodes 12 and 15. If the energy generation layer 13 is formed of the piezoelectric film, electrical energy may be directly generated by the pressure applied to the piezoelectric film. Since the total thickness of the elastic layer 14 may range from several μm to about several tens of μm, a sufficient pressure may be transferred to the energy generation layer 13 even though the elastic layer 14 is deformed.

Also, if the energy generation layer 13 is formed of the electrostatic film, electrical energy may be generated as follows. Positive charges may be induced onto a surface of the second electrode 15 disposed at an upper portion by electrons strongly distributed on a surface of the electrostatic film, and negative charges may be induced onto a surface of the first electrode 12. When external pressure is applied to the electrostatic film, the elastic layer 14 deforms, thereby changing a distance between the second electrode 15 and the energy generation layer 13. Due to this distance change, an electrostatic potential on the surface of the second electrode 15 changes. If the distance between the second electrode 15 and the energy generation layer 13 decreases, the positive charges are strongly induced onto the surface of the second electrode 15. On the other hand, if the distance between the second electrode 15 and the energy generation layer 13 increases, the positive charges induced onto the surface of the second electrode 15 are relatively discharged.

Since electrical energy is generated by using the above-described piezoelectric effect or electrostatic effect, a current may be applied to a load connected between the first electrode 12 and the second electrode 15. Also, the energy harvesting device 10 may sense a capacitance change, and thus, may serve as a touch sensor. Thus, according to the current exemplary embodiment, since the electrical energy harvesting device 10 also has a touch sensor function and generates energy when a touch pressure is sensed, the energy harvesting device 10 according to the current exemplary embodiment performs a sensing operation without the use of an external power source, that is, by using self-generated power. In addition, the energy harvesting device 10 may store surplus energy. Also, since the energy harvesting device 10 having the self-powered touch sensor may be formed of the polymer film, the unit cost of production may be reduced, and process costs may be saved.

The energy harvesting device 10 having the self-powered touch sensor may be applicable to touch screens for portable electronic equipment or display devices. Furthermore, the energy harvesting device 10 having the self-powered touch sensor may be applicable to artificial skin having a tactile function. When the energy harvesting device 10 having the self-powered touch sensor is applied to a touch screen, each of the first and second substrates 11 and 16 may be formed of a transparent material such as PET or PDM and each of the first and second electrodes 12 and 15 may be formed of a transparent conductive material such as indium tin oxide (ITO) or indium zinc oxide (IZO). Also, each of the energy generation layer 13 and the elastic layer 14 may be formed of a transparent material such as PDMS, PVDF, or Teflon®. Also, the first and second substrates 11 and 16 may be spray-coated with a metal nanotube or carbon nanotube (CNT) using silver (Ag) or gold (Au) to form the stretchable electrodes 12 and 15, respectively. The energy harvesting device 10 that has the self-powered touch sensor and includes the stretchable electrodes 12 and 15 may be used as a flexible device or artificial skin.

Figure 2:
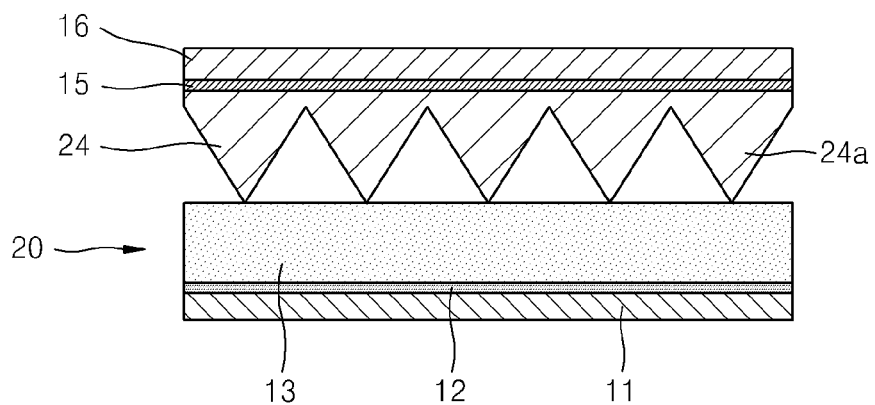
FIG. 2 is a schematic cross-sectional view of an energy harvesting device having a self-powered touch sensor according to another exemplary embodiment.

FIG. 2 is a schematic cross-sectional view of an energy harvesting device 20 having a self-powered touch sensor according to another exemplary embodiment. Referring to FIG. 2, the energy harvesting device 20 is the same as the energy harvesting device 10 of FIG. 1 except for a shape of an elastic layer 24. For example, each of the protrusions 24a of the elastic layer 24 has a width gradually increasing in a direction from an energy generation layer 13 towards a second electrode 15 and gradually decreasing in a direction from the second electrode 15 towards an energy generation layer 13. Thus, each of the protrusions 24a of the elastic layer 24 may have, for example, a pyramidal shape. Although the protrusions 24a of the elastic layer 24 having an inverted triangular shape are illustrated in the sectional view of FIG. 2, the plurality of pyramid-shaped protrusions 24a may be two-dimensionally arranged on a surface of the elastic layer 24. Since each of the protrusions 24a has a pyramidal shape, the elastic layer 24 is more easily deformed. Also, an air layer between the protrusions 24a is significantly deformed. Thus, a capacitance of the energy harvesting device 20 may be significantly changed even though a small contact pressure is applied thereto.

Figure 3:
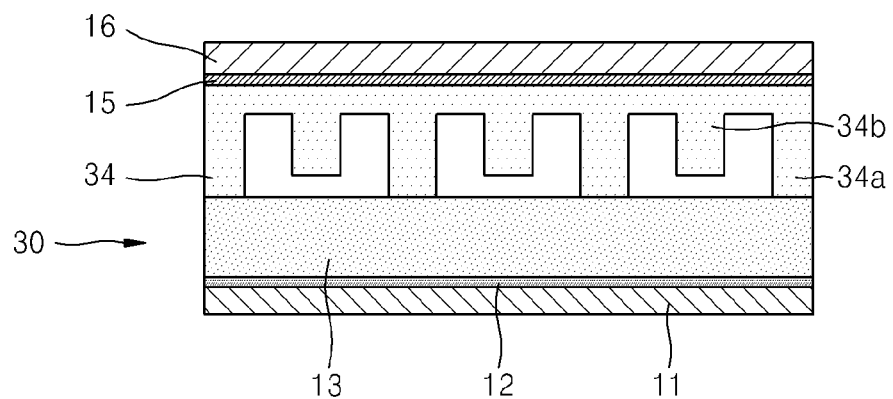
FIG. 3 is a schematic cross-sectional view of an energy harvesting device having a self-powered touch sensor according to a further exemplary embodiment.

FIG. 3 is a schematic cross-sectional view of an energy harvesting device 30 having a self-powered touch sensor according to a further exemplary embodiment. In the energy harvesting device 30 of FIG. 3, an elastic layer 34 may include a plurality of first protrusions 34a that are in contact with a surface of an energy generation layer 13 and a plurality of second protrusions 34b that are not in contact with the surface of the energy generation layer 13. Although the first and second protrusions 34a and 34b are alternately disposed in FIG. 3, the present disclosure is not limited thereto, and the first and second protrusions 34a and 34b may be disposed in other configurations as well. For example, the first protrusions 34a may be disposed only on the outermost portions of the elastic layer 34, and the second protrusions 34b may be disposed between the first protrusions 34a. Alternatively, the first and second protrusions 34a and 34b may be irregularly arranged. Also, although each of the first and second protrusions 34a and 34b has a rectangular shape in FIG. 3, each of the first and second protrusions 34a and 34b may have a pyramidal shape as shown in FIG. 2, or may have another shape as well.

Figure 4:
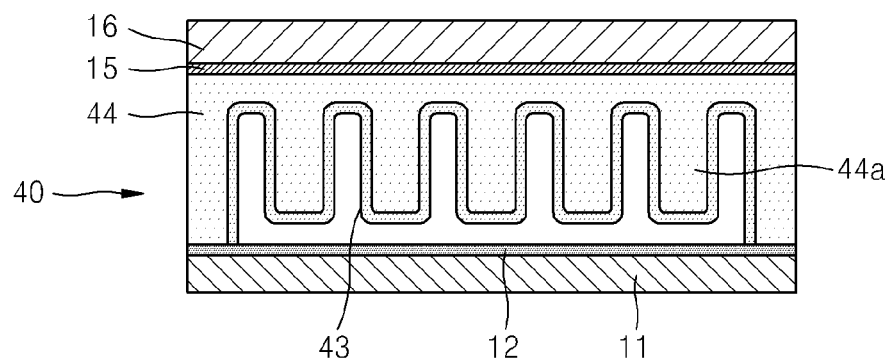
FIG. 4 is a schematic cross-sectional view of an energy harvesting device having a self-powered touch sensor according to yet another exemplary embodiment.

FIG. 4 is a schematic cross-sectional view of an energy harvesting device 40 having a self-powered touch sensor according to another exemplary embodiment. Although the energy generation layer 13 is disposed on the first electrode 12 in the exemplary embodiments of FIGS. 1 to 3, the energy harvesting device 40 of FIG. 4 may include an energy generation layer 43 disposed along a surface of an elastic layer 44. Referring to FIG. 4, the elastic layer 44 includes a plurality of protrusions 44a protruding toward a first electrode 12. The energy generation layer 43 may be disposed along an entire surface of the elastic layer 44. In the current exemplary embodiment, since the energy generation layer 43 is disposed along the surface of the elastic layer 44 including the protrusions 44a, a surface area of the energy generation layer 43 increases. Thus, a change of the energy generation layer 43 due to deformation of the elastic layer 44 increases. Thus, the energy generation efficiency and touch sensing of the energy harvesting device 40 having the self-powered touch sensor may be further improved. Also, the energy harvesting device 40 may be more flexible.

Although vertical-type protrusions 44a are illustrated in FIG. 4, each of the protrusions 44a may have various other types of shapes, for example, a pyramidal shape as shown in FIG. 2. Also, in FIG. 4, only the outermost protrusions 44a are shown as being in contact with a first electrode 12, and the protrusions 44a disposed between the outermost protrusions 44a are spaced apart from the first electrode 12. However, portions of the protrusions 44a disposed between the outermost protrusions 33a may also be in contact with the first electrode 12, according to a regular or irregular pattern.

Figure 5A:
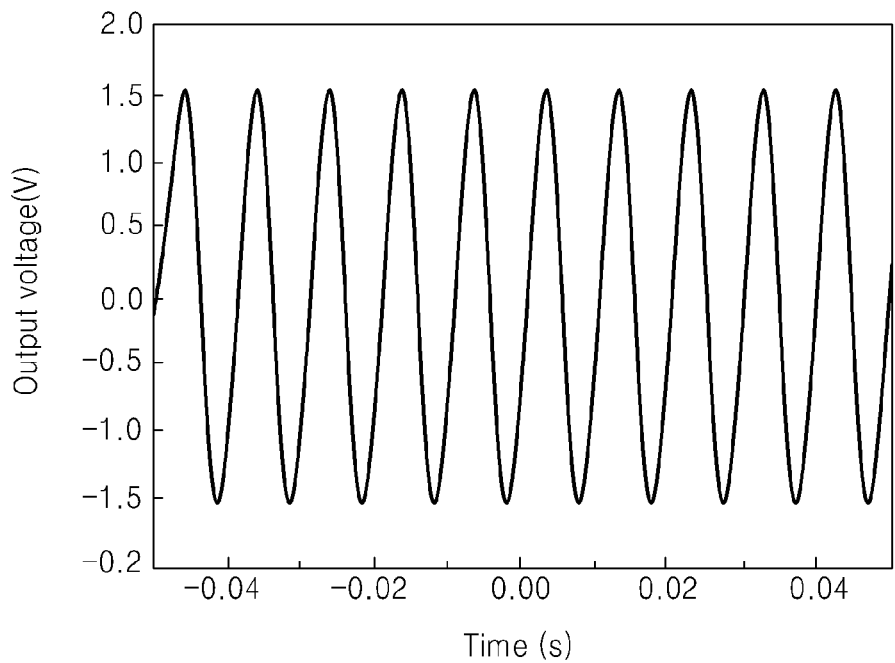
FIGS. 5A to 7B are graphs illustrating an example showing generation of energy in response to various external pressures in the energy harvesting device having the self-powered touch sensor of FIG. 1.
Figure 5B:
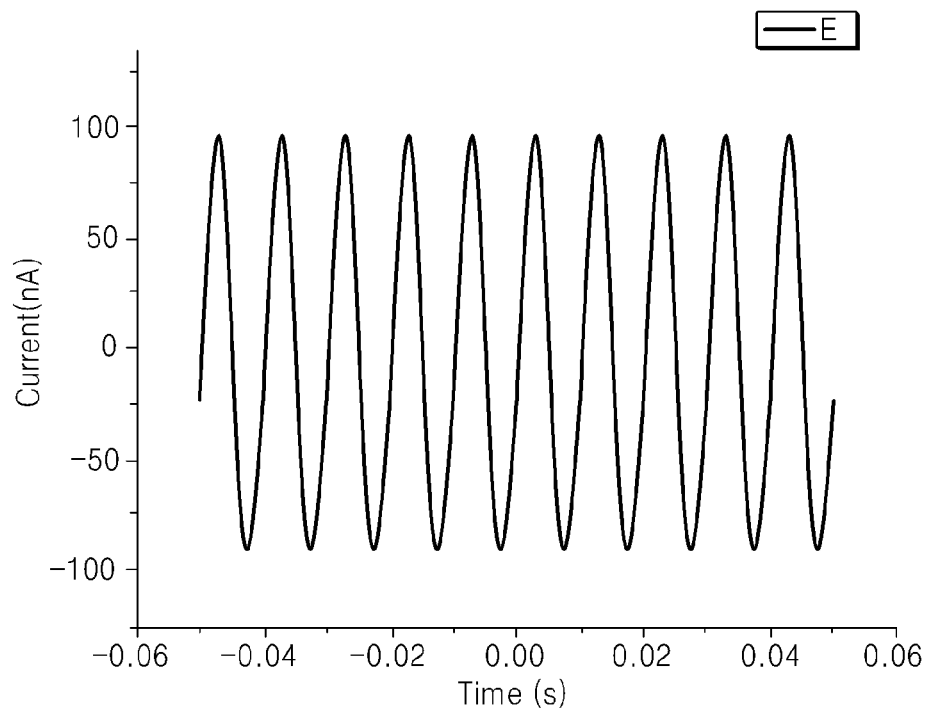
Figure 6A:
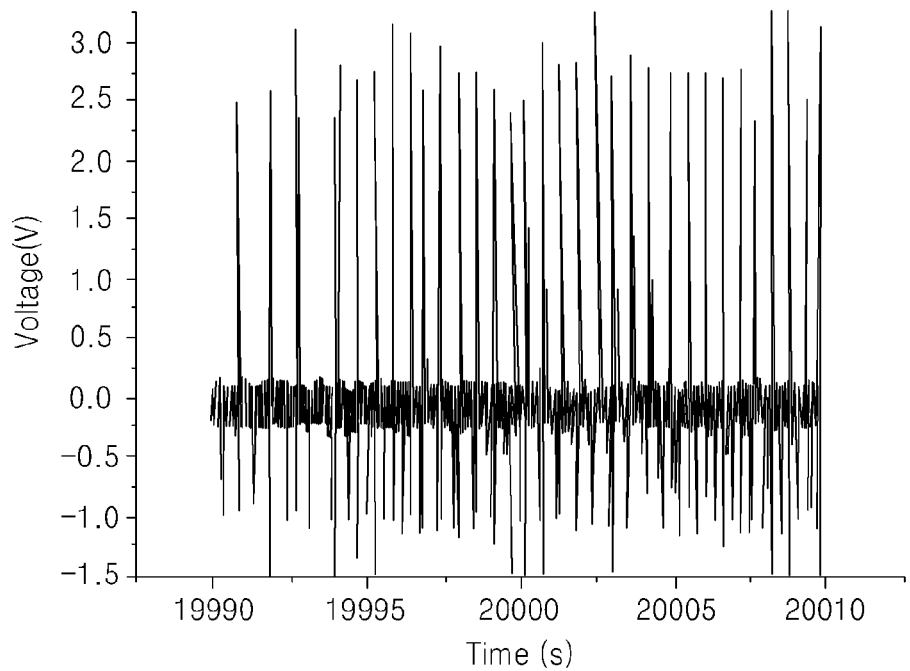
Figure 6B:
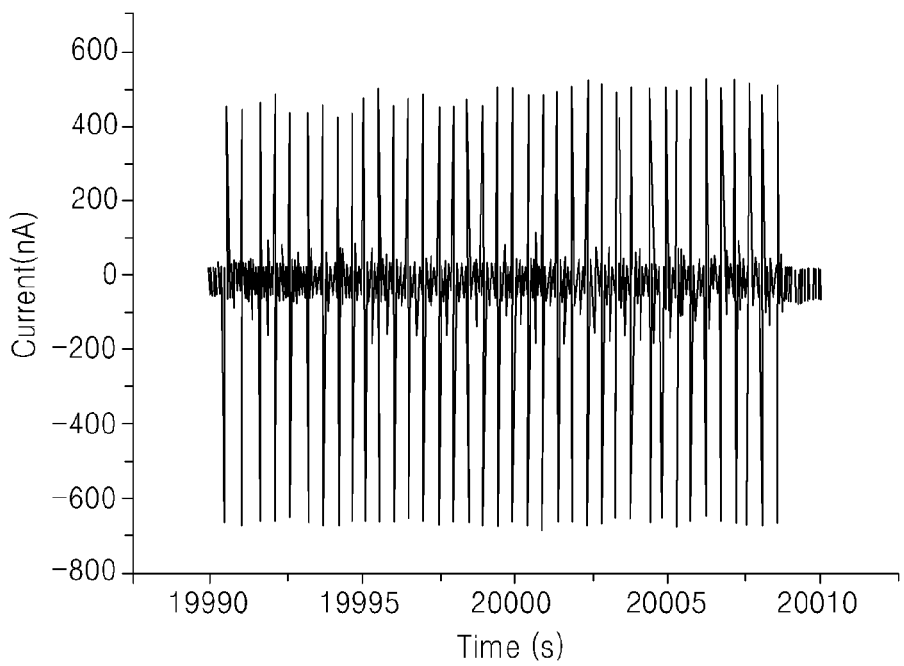
Figure 7A:
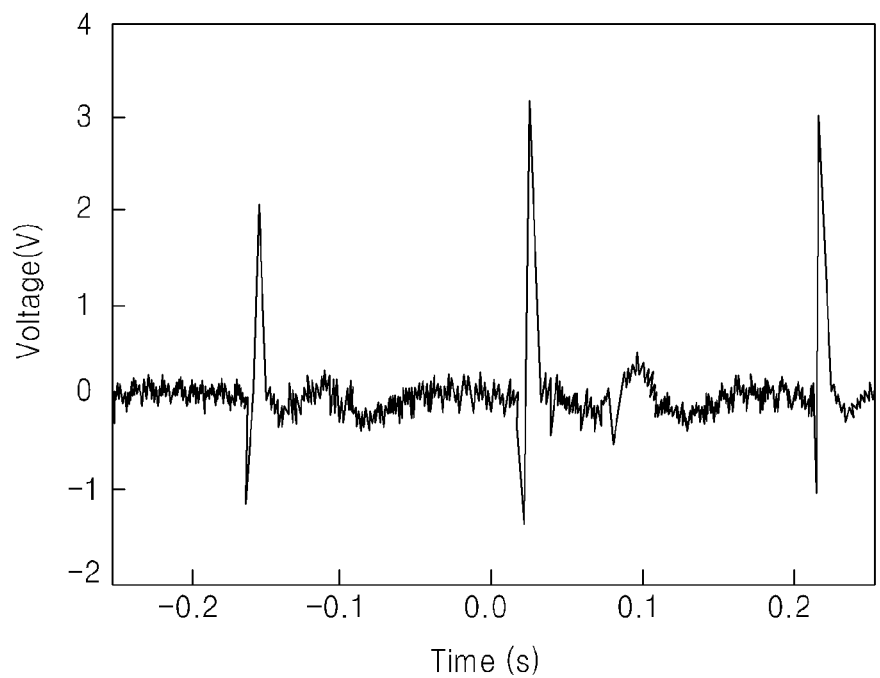
Figure 7B:
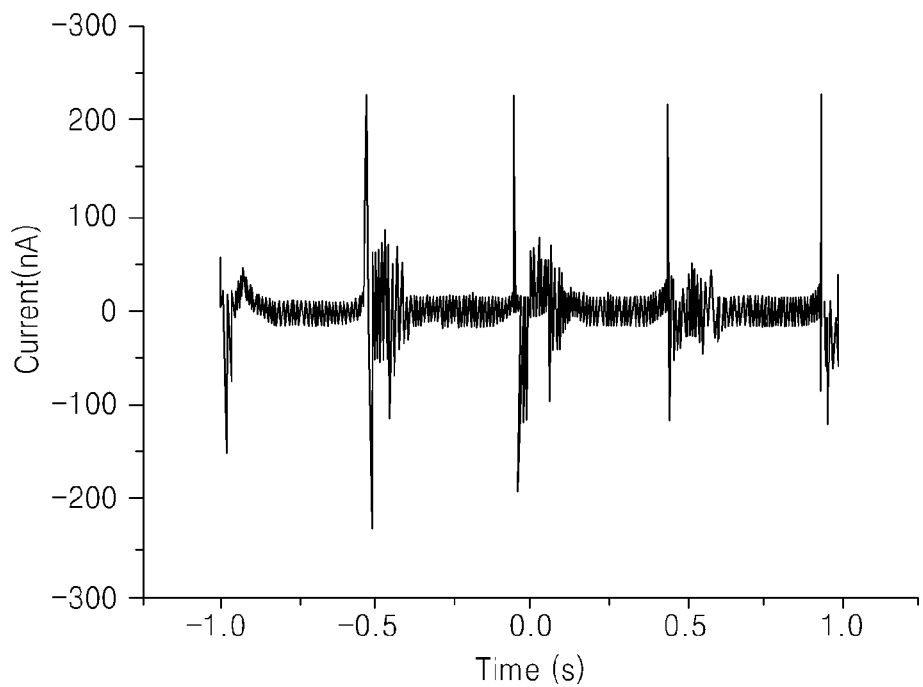

FIGS. 5A to 7B are graphs illustrating an example in which energy is generated in response to various external pressures applied to the energy harvesting device 10 having the self-powered touch sensor of FIG. 1. FIGS. 5A and 5B illustrate an output voltage and output current when electrical energy is harvested from a sound of about 100 dB. FIGS. 6A and 6B illustrate an output voltage and output current of harvested electrical energy when the energy harvesting device 10 having the self-powered touch sensor is repeatedly pushed by a finger. FIGS. 7A and 7B illustrate an output voltage and output current when a sound and pressure are simultaneously applied to the energy harvesting device 10 having the self-powered touch sensor. As is apparent from the graphs of FIGS. 5A to 7B, electrical energy is generated from surrounding noises and pressures.

Figure 8A:
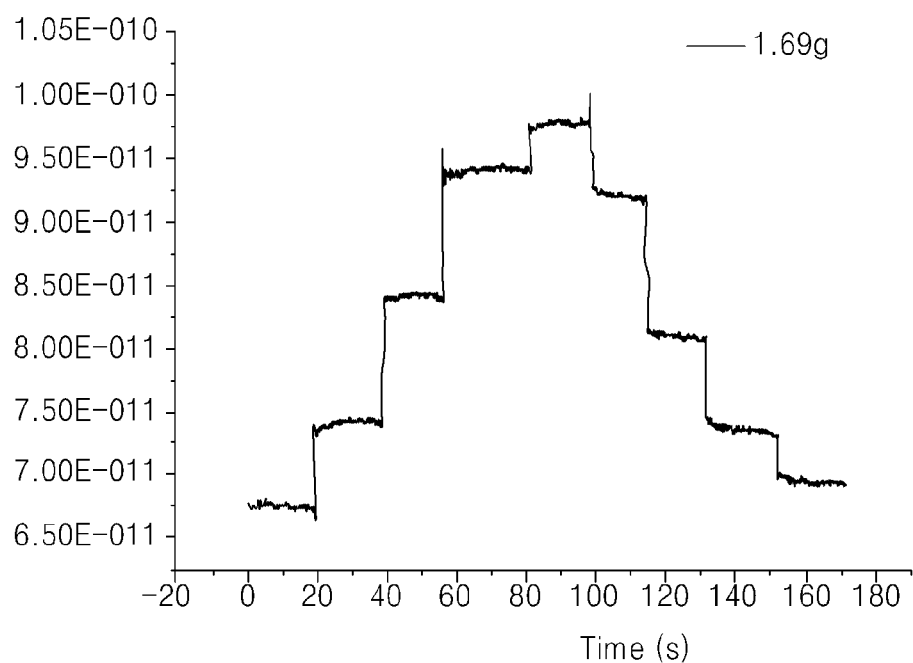
FIGS. 8A to 8C are graphs illustrating an example where a capacitance varies with a touch pressure in the energy harvesting device having the self-powered touch sensor of FIG. 1.
Figure 8B:
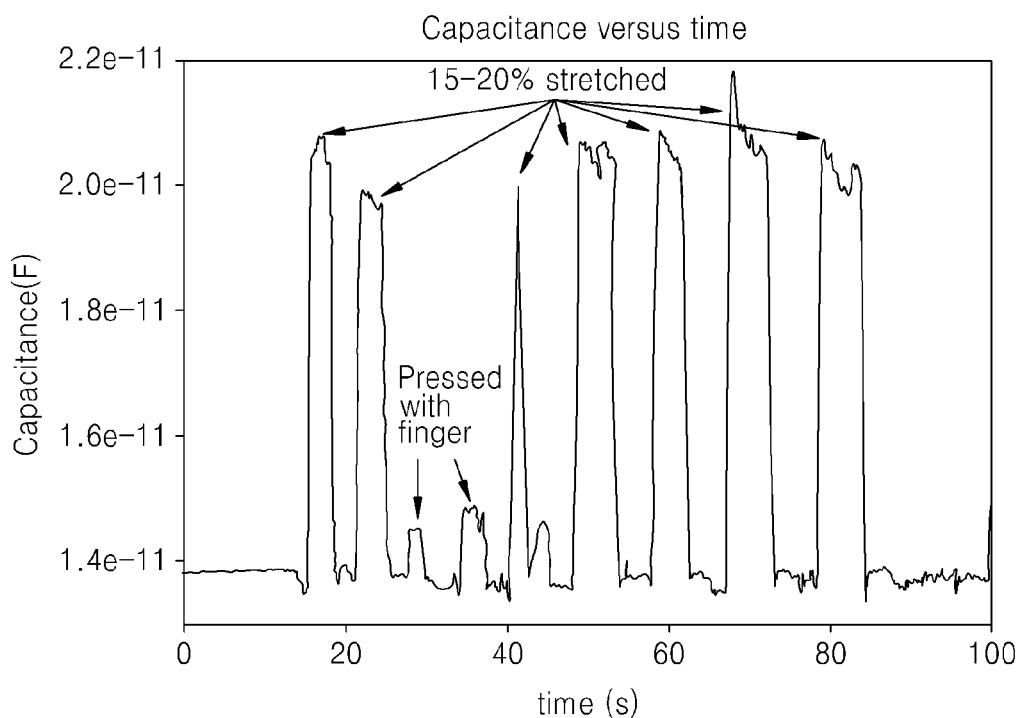
Figure 8C:
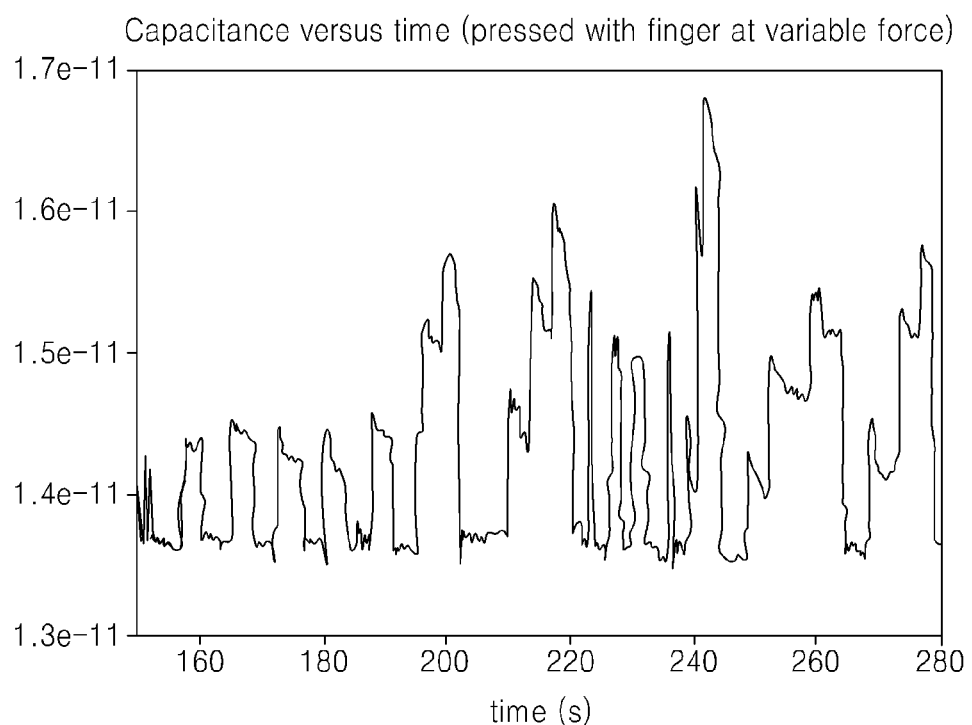

FIGS. 8A to 8C are graphs illustrating an example where a capacitance varies with a touch pressure in the energy harvesting device 10 having the self-powered touch sensor of FIG. 1. FIG. 8A illustrates a change of capacitance versus time when weights of about 1.69 g are piled one by one on the energy harvesting device 10 and then are removed one by one. Referring to FIG. 8A, it is seen that capacitance increases as the number of weights increases, and the capacitance decreases as the number of weight decreases.

FIG. 8B illustrates a change of capacitance when the energy harvesting device 10 having the self-powered touch sensor is pushed or stretched. FIG. 8C illustrates a change of capacitance when the energy harvesting device 10 having the self-powered touch sensor is repeatedly pushed by an irregular force. As is apparent from the graphs of FIGS. 8A to 8C, a change of capacitance is highly sensitive to an external force. Thus, the energy harvesting device 10 may be effectively used as a touch sensor. Furthermore, since the energy harvesting device 10 having the self-powered touch sensor utilizes electrical energy generated in the energy generation layer 13 (e.g., self-generated electrical energy), a separate external power source for measuring the capacitance is not required.

Figure 9:
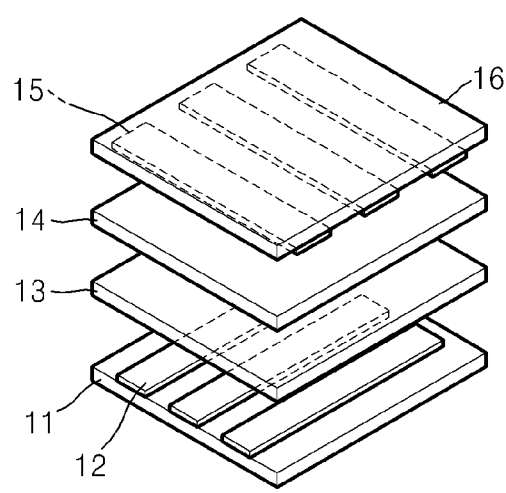
FIG. 9 is a perspective view illustrating an electrode structure of an energy harvesting device having a self-powered touch sensor configured to sense a touch position according to an exemplary embodiment.

To sense the occurrence of a touch as well as a touch position, the first and second electrodes 12 and 15 may be patterned. FIG. 9 is a perspective view illustrating an electrode structure of an energy harvesting device 10 having a self-powered touch sensor which is also configured to sense a touch position. FIG. 9 illustrates an example of simple pattern shapes of the electrodes 12 and 15. Each of the energy generation layer 13 and the elastic layer 14 has a simplified film shape, as shown in the example of FIG. 9. However, it is understood that the film shapes of the energy generation layer 13 and the elastic layer 14 may be different from the film shapes shown in FIG. 9.

Referring to FIG. 9, each of the first and second electrodes 12 and 15 includes an array of patterns arranged perpendicular to each other. As shown in the example of FIG. 9, the first electrode 12 includes an array of a plurality of first electrodes arranged in a pattern in which the first electrodes are parallel to each other and extend linearly in a longitudinal direction. The plurality of first electrodes is successively arranged in a transversal direction. Also, the second electrode 15 includes an array of a plurality of second electrodes arranged in a pattern in which the second electrodes are parallel to each other and extend linearly in a transversal direction. The plurality of second electrodes is successively arranged in a longitudinal direction. According to this structure, a touch occurs at an intersection between a particular first electrode pattern where a change of capacitance occurs among the plurality of first patterns of the first electrode 12 and a particular second electrode pattern where a change of capacitance occurs among the plurality of second patterns of the second electrode 15.

For ease of understanding, exemplary embodiments with respect to the energy harvesting device having the self-powered touch sensor have been described with reference to the accompanying drawings. However, these exemplary embodiments are merely illustrative of the present disclosure, and thus, should not be construed as limiting the scope of the present disclosure. Variations and modifications may be made by one of ordinary skill in the art to the above exemplary embodiments, and thus, the scope of the appended claims is not limited by the above description.

What is claimed is:

1. An energy harvesting device having a self-powered touch sensor comprising:
   first and second electrodes facing each other;
   an energy generation layer disposed on the first electrode; and
   an elastic layer disposed on the second electrode layer, the elastic layer facing the energy generation layer, the elastic layer being configured to be elastically deformed according to pressure applied to the elastic layer,
   wherein the energy generation layer is configured to generate energy according to the pressure applied to the energy generation layer.

2. The energy harvesting device of claim 1, wherein the energy generation layer comprises a piezoelectric film configured to generate electricity in response to the pressure applied thereto or an electrostatic film having a surface that is electrically charged.

3. The energy harvesting device of claim 2, wherein the piezoelectric film comprises ZnO, GaN, ZnMgO, InN, BTO, PZT, PVDF, or a polymer including piezoelectric nanoparticles and the electrostatic film comprises a material having a natural surface potential and selected from among fluorinate polymer, polyethyleneterephthalate (PET), or polypropylene, or comprises a material having a surface that is artificially polarized and selected from among quartz or $SiO_2$.

4. The energy harvesting device of claim 1, wherein the elastic layer has a porous nanostructure comprising protrusions which protrude toward the first electrode, and further comprising pores which are defined between the protrusions.

5. The energy harvesting device of claim 4, wherein each of the pores has a diameter of about 500 nm to about 2 μm and a depth of about 1 μm to about 8 μm.

6. The energy harvesting device of claim 4, wherein each of the protrusions has a rectangular shape and protrudes vertically toward the first electrode.

7. The energy harvesting device of claim 4, wherein each of the protrusions has a pyramidal shape with a width gradually increasing in a direction moving from the energy generation layer towards the second electrode and gradually decreasing in a direction moving from the second electrode towards the energy generation layer.

8. The energy harvesting device of claim 4, wherein the protrusions comprise first protrusions that are in contact with a surface of the energy generation layer and second protrusions that are spaced apart from the surface of the energy generation layer.

9. The energy harvesting device of claim 1, wherein each of the first and second electrodes is formed of a transparent material.

10. The energy harvesting device of claim 1, wherein each of the first and second electrodes comprises a stretchable electrode formed by spray-coating a metal nanotube or a carbon nanotube.

11. The energy harvesting device of claim 1, wherein the first electrode comprises an array of first electrodes arranged in a pattern in which the first electrodes are parallel to each other and extend linearly in a first direction, and the second electrode comprises an array of second electrodes arranged in a pattern in which the second electrodes are parallel to each other and extend linearly in a second direction perpendicular to the first direction.

12. An energy harvesting device having a self-powered touch sensor comprising:
   first and second electrodes facing each other;
   an elastic layer disposed on the second electrode and comprising protrusions protruding toward the first electrode and pores between the protrusions; and
   an energy generation layer disposed along a surface of the elastic layer,
   wherein the energy generation layer is configured to generate energy according to the pressure applied to the energy generation layer, and
   the elastic layer is configured to be elastically deformed according to pressure applied to the elastic layer.

13. The energy harvesting device of claim 12, wherein the energy generation layer comprises a piezoelectric film configured to generate electricity in response to pressure applied thereto or an electrostatic film having a surface that is electrically charged.

14. The energy harvesting device of claim 13, wherein the piezoelectric film comprises ZnO, GaN, ZnMgO, InN, BTO, PZT, PVDF, or a polymer including piezoelectric nanoparticles and the electrostatic film comprises a material having a natural surface potential and selected from among fluorinate polymer, polyethyleneterephthalate (PET), or polypropylene, or comprises a material having a surface that is artificially polarized and selected from among quartz or $SiO_2$.

15. The energy harvesting device of claim 12, wherein each of the protrusions has a rectangular shape and protrudes vertically toward the first electrode.

16. The energy harvesting device of claim 12, wherein each of the protrusions has a pyramidal shape with a width gradually increasing in a direction moving from the energy generation layer towards the second electrode and gradually decreasing in a direction moving from the second electrode towards the energy generation layer.

17. The energy harvesting device of claim 12, wherein the protrusions comprise first protrusions that are in contact with a surface of the first electrode and second protrusions that are spaced apart from the second electrode.

18. The energy harvesting device of claim 12, wherein each of the first and second electrodes is formed of a transparent material.

19. The energy harvesting device of claim 12, wherein each of the first and second electrodes comprises a stretchable electrode formed by spray-coating a metal nanotube or a carbon nanotube.

20. The energy harvesting device of claim 12, wherein the first electrode comprises an array of first electrodes arranged in a pattern in which the first electrodes are parallel to each other and extend linearly in a first direction, and the second electrode comprises an array of second electrodes arranged in a pattern in which the second electrodes are parallel to each other and extend linearly in a second direction perpendicular to the first direction.

* * * * *